(12) United States Patent
Hurle et al.

(10) Patent No.: US 6,294,017 B1
(45) Date of Patent: Sep. 25, 2001

(54) GROWTH OF SEMICONDUCTOR SINGLE CRYSTALS

(75) Inventors: Donald Thomas James Hurle; Gordon Charles Joyce, both of Malvern; Kathryn Elizabeth McKell, Stockport, all of (GB)

(73) Assignee: The National Research Development Corporation, London (GB)

( * ) Notice: Subject to any disclaimer, the term of this patent is extended or adjusted under 35 U.S.C. 154(b) by 0 days.

(21) Appl. No.: 08/020,443

(22) Filed: Feb. 22, 1993

Related U.S. Application Data

(63) Continuation of application No. 07/457,689, filed as application No. PCT/GB88/00505 on Jun. 27, 1988, now abandoned.

(30) Foreign Application Priority Data

Jun. 30, 1987 (GB) .................................................. 8715327

(51) Int. Cl.$^7$ .................................................. C30B 15/26
(52) U.S. Cl. ................................ 117/13; 117/14; 117/15; 117/24; 117/202; 117/208
(58) Field of Search ........................................ 156/601, 607, 156/617.1, 618.1, 620.2; 422/106, 249; 117/13, 14, 15, 201, 202, 208

(56) References Cited

U.S. PATENT DOCUMENTS

| | | | |
|---|---|---|---|
| 2,908,004 | * 10/1959 | Levinson | 156/601 |
| 3,013,721 | 12/1961 | Foster | 235/151 |
| 3,621,213 | * 11/1971 | Jen et al. | 156/601 |
| 3,761,692 | * 9/1973 | Cope | 156/601 |
| 3,934,983 | * 1/1976 | Bradsley et al. | 156/601 |
| 3,980,438 | * 9/1976 | Castonguay et al. | 156/601 |
| 4,668,481 | * 5/1987 | Watanabe et al. | 156/607 |
| 4,857,278 | * 8/1989 | Gevelber et al. | 422/106 |

FOREIGN PATENT DOCUMENTS

| | | | |
|---|---|---|---|
| 1816068 | 8/1969 | (DE) | 156/617.1 |
| 0115121 | 8/1984 | (EP) | 156/617.1 |
| 1 434 527 | 5/1976 | (GB) | . |
| 1 465 191 | 2/1977 | (GB) | . |
| 1 494 342 | 12/1977 | (GB) | . |
| 2140704A | 12/1984 | (GB) | 156/617.1 |
| 58-145692 | 8/1983 | (JP) | 156/601 |
| 58-145693 | 8/1983 | (JP) | 156/617.1 |
| 58-145694 | 8/1983 | (JP) | 156/601 |
| 59184796 | * 10/1984 | (JP) | 156/601 |
| 59184797 | * 10/1984 | (JP) | 156/601 |
| WO 83/02464 | 7/1983 | (WO) | . |

OTHER PUBLICATIONS

D.T.J. Hurle, et al, "A Technique For Experimentally Determining The Transfer Function Of A Czochralski Pulling Process" Journal of Crystal Growth 74 (1986) pp. 480–490, North–Holland, Amsterdam.

Patzner et al, "Automatic Diameter Control Czochralski Crystals", Solid State Technology Oct. 1967 pp. 25–30.*

* cited by examiner

*Primary Examiner*—Robert Kunemund
(74) *Attorney, Agent, or Firm*—Nixon & Vanderhye P.C.

(57) ABSTRACT

A method and apparatus for growing single crystal of GaAs, etc uses the Czochralski techniques. Control of crystal (1) diameter is by a closed loop (9, 10, 24, 7, 6) control of melt (4) temperature in response to crystal weight signals (9) W or dW/dt. The invention injects a test signal St (22, 26) into the control loop and performs a signal processing (21), e.g. cross correlation, on St and crystal weight signal. Peak amplitude of correlation values is related to the growing crystal shape. This is used by comparison with reference values (24) to control the growing-out phase from seed diameter (16) to full diameter of the crystal (1).

23 Claims, 6 Drawing Sheets

GROWTH OF SEMICONDUCTOR SINGLE CRYSTALS

This is a continuation of application Ser. No. 07/457,689 filed Dec. 28, 1989, now abandoned, which is the material stage of PCT/GB88/00505, filed Jun. 30, 1987.

BACKGROUND OF THE INVENTION

1. Field of the Invention

This invention relates to a method and apparatus for growing single crystalline material.

2. Discussion of Prior Art

Apparatus for growing crystals by the known Czochralski technique is described for example in GB 1,494,342. A seed crystal is dipped into a melt of the crystal to be grown then rotated and slowly withdrawn. By suitable adjustment of the melt temperature and the rotation and withdrawal rates a desired shape of crystal is grown. Ideally a crystal increases smoothly from the seed diameter up to the desired diameter and then continues at a uniform diameter until tapered off at growth end. Uniform growth diameter has been achieved for the difficult to grow III–V materials such as GaAs with apparatus as described in GB 1,494,342 where the growing crystal is weighed by a load cell during growth.

In this the crystal weight or some function of weight is compared with an expected value and any error which occurs is used to correct the power supplied to the melt and/or the pull speed.

One weakness of the method may be found during the grow-out phase when the system attempts to control the increase in diameter from a narrow seed to a much larger final diameter. The signals are initially small and the control of cone angle is not precise. A simple increase in system gain during this phase may help but can easily lead to instability or roughness of the crystal shape leading to crystalline faults.

Smooth control of cone angle is important in the growth of many materials including GaAs single crystals in order to achieve low densities of dislocations in the crystal.

A further and more severe problem arises when certain semiconductors (e.g. GaAs) are grown at low pull rates especially combination with isothermal melts required for better quality crystals. It is possible for the crystal to grow out across the surface of the melt and simultaneously to be growing down under the surface. In spite of this real growth of the crystal the weight sensor may detect little or no increase in weight of the crystal. This lack of weight change is due to the near horizontal surface tension forces (which therefore have little effect on the load cell) and also the fact that the density of the solid in the 'anomalous' materials is less than that of the liquid. This means that the solid below the melt surface is buoyant and subtracts from the measured weight.

Under these conditions control may be lost completely and the melt surface freezes, often breaking the seed and terminating the run. This can be an expensive failure in production runs where large and costly melts are involved.

SUMMARY OF THE INVENTION

The present invention overcomes the above problem by providing a method and apparatus for controlling the grow-out phase during crystal growth.

According to this invention a method of controlling the diameter of a crystal in a crystal growing system includes the steps of providing a melt of material in a crucible heated by a heater, bringing a seed crystal into contact with the melt, providing relative rotation between the seed crystal and melt, withdrawing and rotating the seed slowly so that a crystal grows from the seed crystal, weighing the growing crystal or the melt to provide a signal indicative of the weight of the growing crystal, providing a feedback loop using the weight signal to control the heater and hence control crystal diameter, characterised by the steps of applying small perturbations to the system, providing a signal processing on measured crystal weight signals, and using the result of the signal processing to vary the growth conditions and obtain the required diameter changes during grow out from the seed diameter to the full crystal diameter.

The perturbations may be variations in: the power signal to the heater, the pull rate, the rotation rate of crystal and/or crucible, or an applied magnetic field. These perturbations may be a pseudo random series of pulses, a rectangular wave, or a series of short pulses, or even the noise inherent in growth systems.

The signal processing may be cross or auto correlation, or signal averaging, or Fourier analysis.

The results of the signal processing may be used to vary the power applied to the heater, or the pull or rotation rates or the strength of an applied magnetic field.

The perturbations may be applied during grow out from a seed to a full diameter phase only or during the growth of the complete crystal.

The amount of perturbation is small. When growing anomalous material it is in principle quite simple to obtain an immediate indication of the crystal diameter masked by the growth under the melt. For example the pull rod is suddenly moved axially. The change in apparent weight of the crystal indicates the present diameter. Following measurement the crystal is restored to its original position. In practice there is considerable noise present in the crystal pulling system due to, e.g. vibration, convection in the melt, turbulence of the hot gases etc. This means that large movements of the crystal would be required in order to achieve accurate measurement, especially for small seed diameters. Such large perturbations would seriously degrade the crystal perfection and therefore a more refined technique is necessary.

The signal processing of the present invention allows use of small perturbations that do not degrade crystal growth, and yet provide accurate measurement of growing diameters. A typical perturbation amplitude may be less than the amplitude range of noise present.

According to this invention apparatus for growing crystals comprises:

a crucible for containing a melt of the crystal to be grown, a heater for heating the melt, means for providing relative rotation between a seed crystal and the melt, means for pulling a crystal from the melt, a load cell cell for measuring the weight of a growing crystal, and feedback means for controlling the temperature of the melt in response to changes in the load cell output to grow a controlled diameter crystal, characterised by:

signal processor means for processing signals received from the load cell and from signals applied to the feedback means, means for comparing the output of the signal processor with a reference signal to provide a correction signal for the feedback means.

The signals applied to the feedback means may include small amplitude test signals of a pseudo random nature, a rectangular wave, or other suitable perturbing shape. Such test signals may be applied from a test signal generator and mixed into the signals applied to the feedback means.

The signal processor may include a cross or auto correlator, a signal averager, or a Fourier analyser.

An interface may be arranged between the load cell and the signal processor whereby part of the apparatus operates on analogue signals and the remainder operates on digital signals. The signals applied to the heater, and pull rod and signals received from the load cell may be analogue whilst the signal processing and error correction is performed with digital signals. Alternatively the whole system may operate with digital signals or with analogue signals.

Low pull rates and isothermal melts are needed for a variety of crystals where high crystal perfection is required. For example the materials which could be used in integrated circuits e.g. Si, GaAs, InP, InAs, InSb, Ge. Also for detector materials a range of halides and chalcogenides are needed eg CdTe, and PbTe.

BRIEF DESCRIPTION OF THE DRAWINGS

The invention will now be described, by way of example only, with reference to the accompanying drawings of which.

DETAILED DESCRIPTION OF PREFERRED EMBODIMENTS

Figure 1:
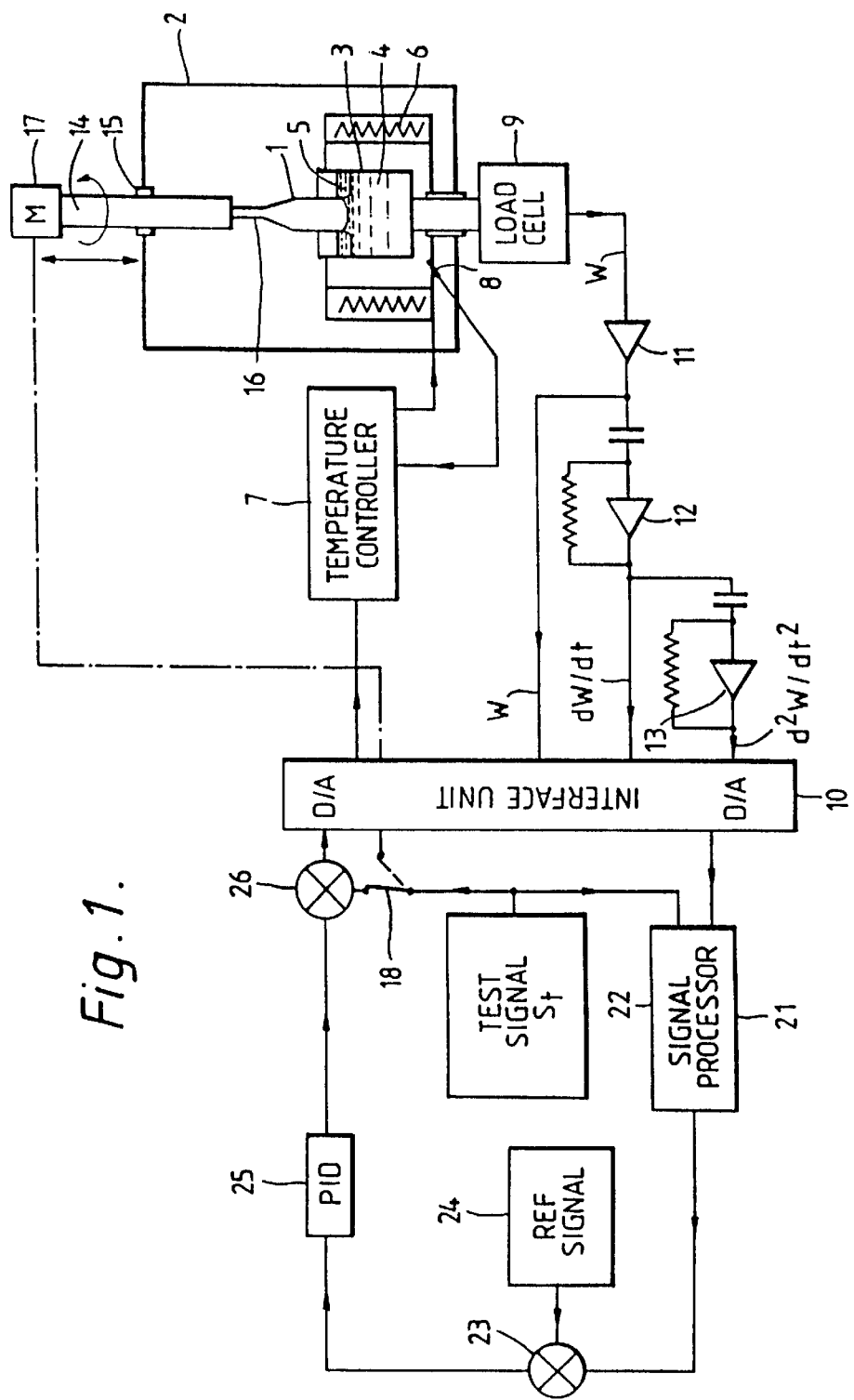
FIG. 1 is a diagrammatic view of crystal growing apparatus.

As seen in FIG. 1 apparatus for growing GaAs crystals 1 by the Czochralski technique comprises a pressure vessel 2. Inside the vessel 2 is a pyrolitic boron nitride crucible 3 containing GaAs 4 together with an amount of boric oxide. This boric oxide forms a layer 5 on top of the melt 4 to prevent As evaporation as taught in GB 1,113,069.

An electric resistance heater 6 surrounds the crucible 3 and is supplied with power from a proportional integrator differentiator (PID) temperature controller 7. A typical temperature is about 1511 K. Close to the crucible 3 is a thermocouple 8 which connects to the temperature controller 7 for maintaining a desired temperature of melt 4. A load cell 9 is arranged below the crucible 4 to weigh the melt 4 and crucible 3 and hence provide a crystal weight signal W. Crystal weight is original melt weight less load cell 9 output. Alternatively the pull rod 14 and growing crystal 1 may be weighed to provide the signal W. Output W from the load cell 9 is taken via amplifier 11 to an interface unit 10 directly to a first differentiator 12 and a second differentiator 13. Output from the first and second differentiators 12 and 12 are also fed direct into the interface unit 10. The interface unit 10 provides an analogue to digital (A/D) and digital to analogue (D/A) conversion on signals applied thereto.

A pull rod 14 extends through seals 15 into the vessel 2 above the crucible 3 and has a seed crystal 16 fixed at the bottom of the rod 14. The pull rod 14 may be rigid as shown. Alternatively it may be flexible, e.g. a ball chain or multi stranded wire rope. A motor 17, rotates and moves axially the pull rod 14. Thus the seed 16 can be lowered through the boric oxide layer 5 into the melt 4 then slowly raised and rotated to grow a crystal as shown. This, apart from the interface unit 10, is known from GB 1,494,342.

Alternatively, or additionally, the crucible 3 may be rotated and or lowered to pull the crystal 1 from the melt 4.

A signal processor 21 takes signals W, dW/dt or $d^2W/dt^2$ as required from the interface 10 and also test signals from a test signal generator 22. Output from the signal processor 21 is mixed in a first mixer 23 with a reference signal from a reference signal generator 24. This reference generator 24 is programmed to output a desired signal which varies with time during grow-out of a crystal, is a constant value during the main growth of the crystal, and is a decreasing value during the final grow-in stage of crystal growth. Output from the first mixer 23 is to another PID controller 25 which converts error signals into appropriate values for use by the temperature controller 7. Signals from the PID 25 are fed to a second mixer 26 where the test signal from generator 22 is added before conversion to analogue values in the interface 10 for use by the temperature controller 7.

The test signal generator 22 provides a square wave output of period of 20 to 120 seconds, e.g. 80 seconds. The signal processor 21 performs a cross correlation on the weight function signal dW/dt and the test signal St. Since the test signal St is injected, by mixer 26, into the temperature controller 7 a response to St will be present in the load cell output some time later. However, even with a properly chosen St, the amplitude must be kept small to minimise the effect on the crystal. It is therefore difficult to detect the effect of St in the load cell output W in the presence of the system noise see FIGS. 7, 8 described below. This is the reason for performing the cross correlation function; it is a powerful way of detecting small signals in the presence of noise. Increasing the amplitude of the test signal would make its detection easier but at the expense of generating crystalline faults in the growing crystal.

For some systems the signal processor 21 may perform a cross correlation without use of test signals St, i.e. using noise inherent in the system. In this case the output from mixer 26 is fed direct into the signal processor 21. Alternatively an auto correlation may be performed on the output from the interface unit 10 to the signal processor 21.

The processing of a digital signal from the interface unit 10 may be performed by a suitably programmed computer. This will receive input from the load cell, first and second differentiators, and output values for the temperature controller.

These output values from the processor 21 may be the height of the correlation peak, representing crystal radius cone angle, and amplitude of St, or variation in time delay of the correlation peak as described below. The signal processor 21 thus needs to calculate continuously a correlation function and output correlation peak value.

One computer is a Hewlett Packard HP 300 series. Many suitable programs are available for performing cross correlation on two inputs. Theory of correlation is taught for example in "Signal Processing using Analogue & Digital Techniques" by K G Beauchamp; published by George Allen & Unwin Ltd starting at page 412. A hard-wired cross correlator e.g. HP 3721A may be used instead of a computer.

Figure 9:
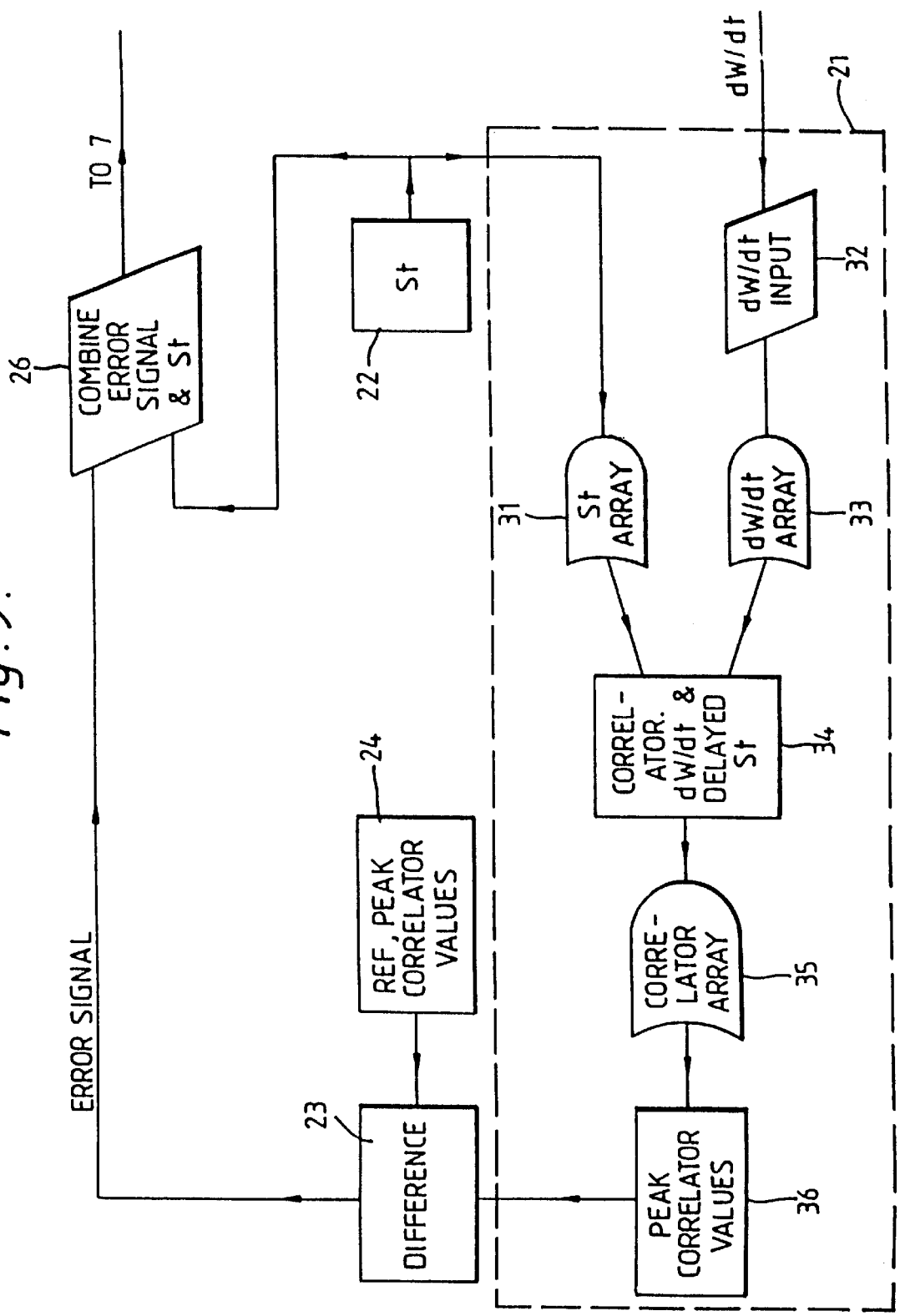
FIG. 9 is a flow chart for a computer to calculate a cross correlation function.

Further details of the signal processor 21 are explained with reference to the flow chart of FIG. 9. The test signal St is a square wave of 80 second period, Signals St are updates each second, and placed in a test signal array 31. This stores consecutive values in a 130 size array.

An input/output 32 receives data dw/dt from the interface unit 10. Data is received once per second; each value received is an average of a burst of A/D readings from the load cell 9, FIG. 1. Consecutive values of dw/dt are stores in a data array 33 of 80 unit array size.

A correlator 34 correlates dw/dt and delayed test signals St once per second and the correlation values are stored in a correlation array 35. This correlation array has an array size of 50; it updates and stores consecutive correlation values and applies smoothing if required. For the cross correlation calculation each dw/dt value is multiplied with a non-delayed value of St and summed to form the first correlation value to place in the correlator array 35. Each value of dw/dt is then multiplied with St values delayed by one second and the sum of these placed in the correlator array. This is repeated for increasing delays in steps of one second up to 49 seconds delay time. Whilst running the correlator array 35 contains 50 values of correlation calculations, i.e. the first 50 values shown in the FIGS. 3(a), 3(b).

Figure 3A:
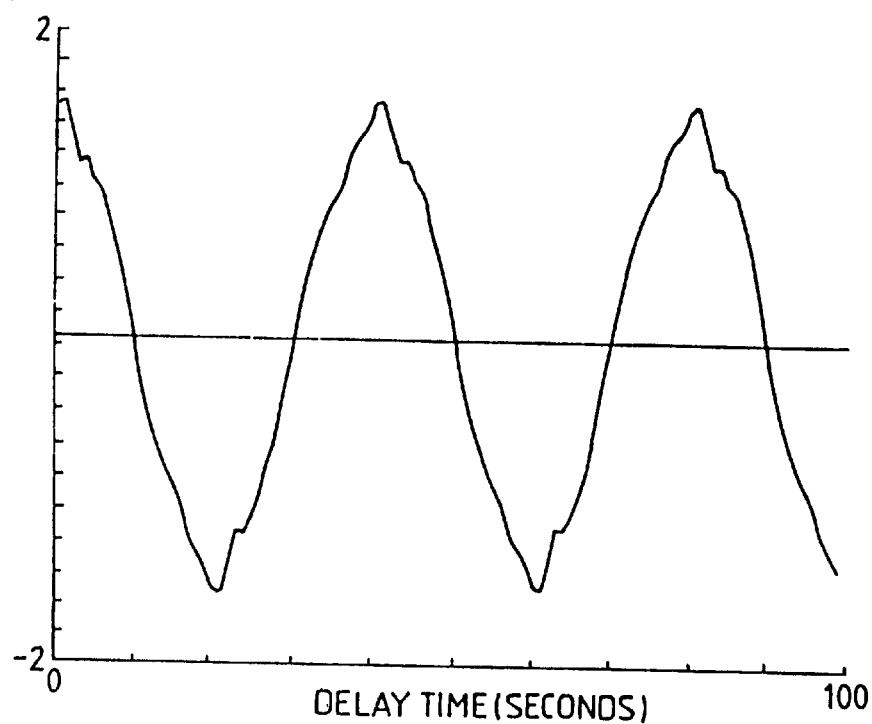
FIGS. 3(a) and (b) are graphs showing signal processing of load cell output.
Figure 3B:
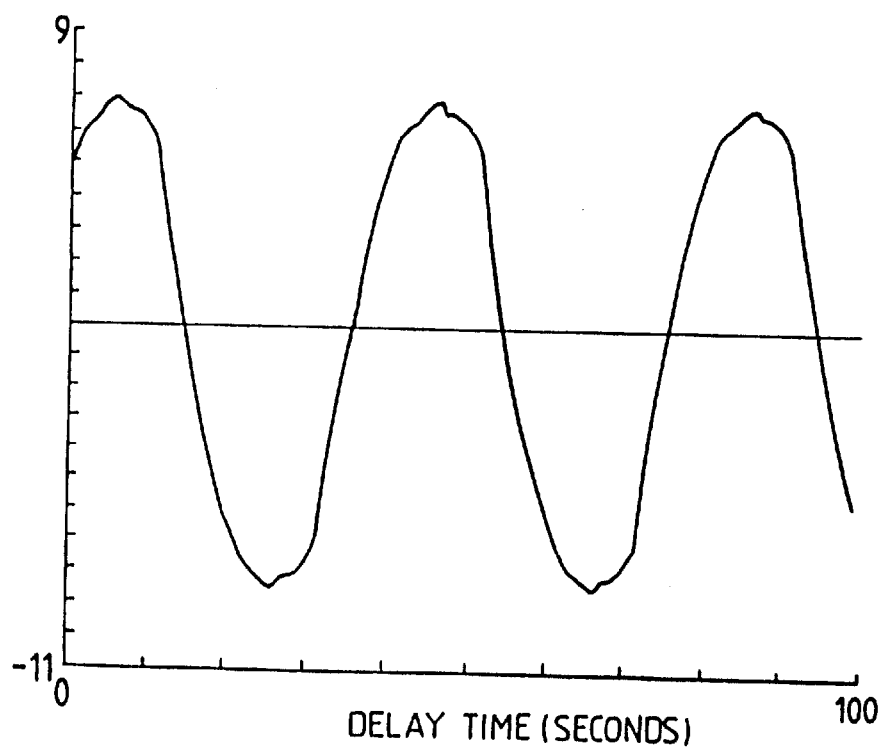

Successive correlation values from the correlator array are processed 36 to determine peak correlation values (see FIGS. 3(a), 3(b)) stored in the array 35. Peak correlator values are compared, 23, with reference correlator values 24 to produce an error signal for supply to the temperature controller 7 of FIG. 1.

The analogue section of FIG. 1 may be replaced by digital equivalents so the whole section operates on digital signals.

Operation to grow a GaAs crystal will now be described. Measured amounts of GaAs and boric oxide are placed in the crucible 3 in the pressure vessel 2. The heater 6 is operated to raise the crucible temperature up to a temperature slightly in excess of the melting point of GaAs 1511 K in order to establish a melt 4. Meantime a pressure of about 20 atmospheres is maintained in the pressure vessel 2. The GaAs seed 16 is lowered into the melt 4. The pull rod 14 is then rotated and slowly withdrawn, typical rates of withdrawal and rotation are 0.3 mm/min and 10 rpm respectively.

Figure 2:
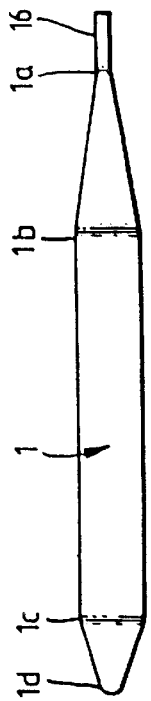
FIG. 2 is a view of a desired crystal shape.

The desired shape of crystal to be grown is as shown in FIG. 2. After seed-on at 1a it is necessary to increase the crystal diameter, i.e. the grow-cut phase, to its desired final value at 1b. This grow-out phase is most difficult since the growing crystal may be growing out across the surface of the melt 4 and simultaneously growing down under the surface. Such growth may not be detected by the load cell 9. The test signal St is used to overcome this problem. The square wave signal St added to the temperature control signal by the second mixer 26 results in small temperature changes to the melt 4. This results in small changes to the growing crystal 1 which are measured by the load cell 9. The load cell output W is differentiated in the first differentiator 12 to give dW/dt and fed via the interface 10 into one port of the signal processor 21. This signal dW/dt is then cross correlated with the signal St from the test signal generator 22.

FIGS. 3(a) and (b) show the cross correlation function obtained from the signal processor 21 during growth of a crystal; the curves were calculated about 2.5 hours apart. The horizontal axis represents correlator time delay. Comparison of these figures shows that the correlation amplitude has increased during this period by a factor of ×5 and also that the time delay of the peaks has increased by 5 seconds. The height of the first positive peak is related to the cone angle, the crystal diameter, and the amplitude of the test signal St.

The transfer function (T.F.) of the system is determined, e.g. as taught in J. Crystal Growth 74 (1986) 480–490, Hurle et al. Computer simulation using the transfer function has shown that the amplitude of the cross correlation function peak is a well conditioned measure of the shape of the growing crystal.

The height of this correlation peak is therefore used to control the crystal shape, i.e. the difference between reference signal and the correlation peak is the error signal used by the PID 25 to control heater 6.

The amplitude of the test signal St may be varied in order to minimise disturbance to the crystal whilst maintaining adequate correlation peak values.

Figure 4:
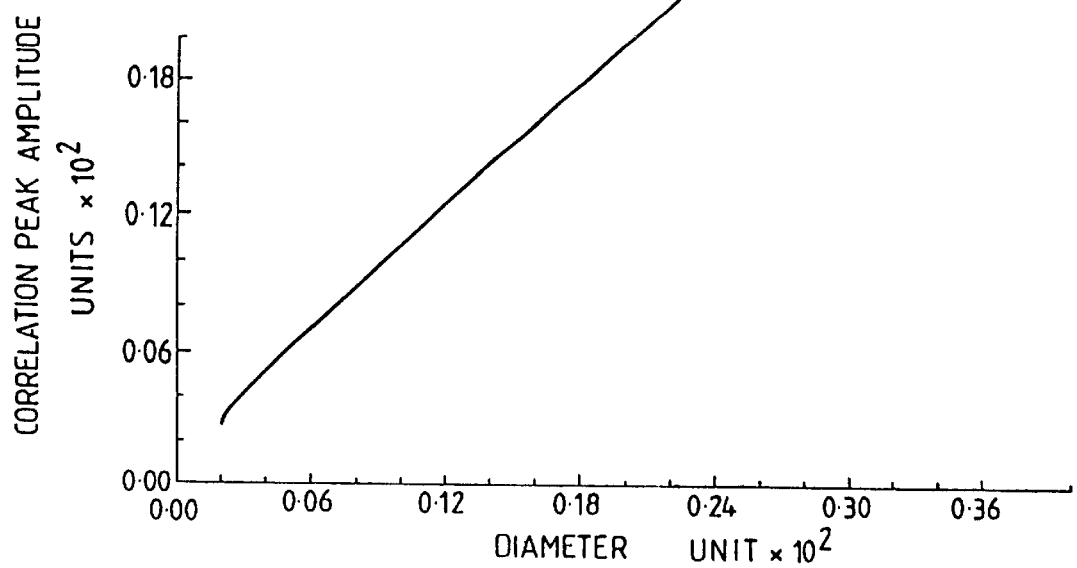
FIG. 4 is a graph of cross correlation function against tire when when pulling a crystal with a half cone angle of 30.

FIG. 4 shows how the amplitude of the correlation peak varies with crystal radius for a half cone angle of 30 . The linear variation is obtained for various half cone angle values.

Figure 5:
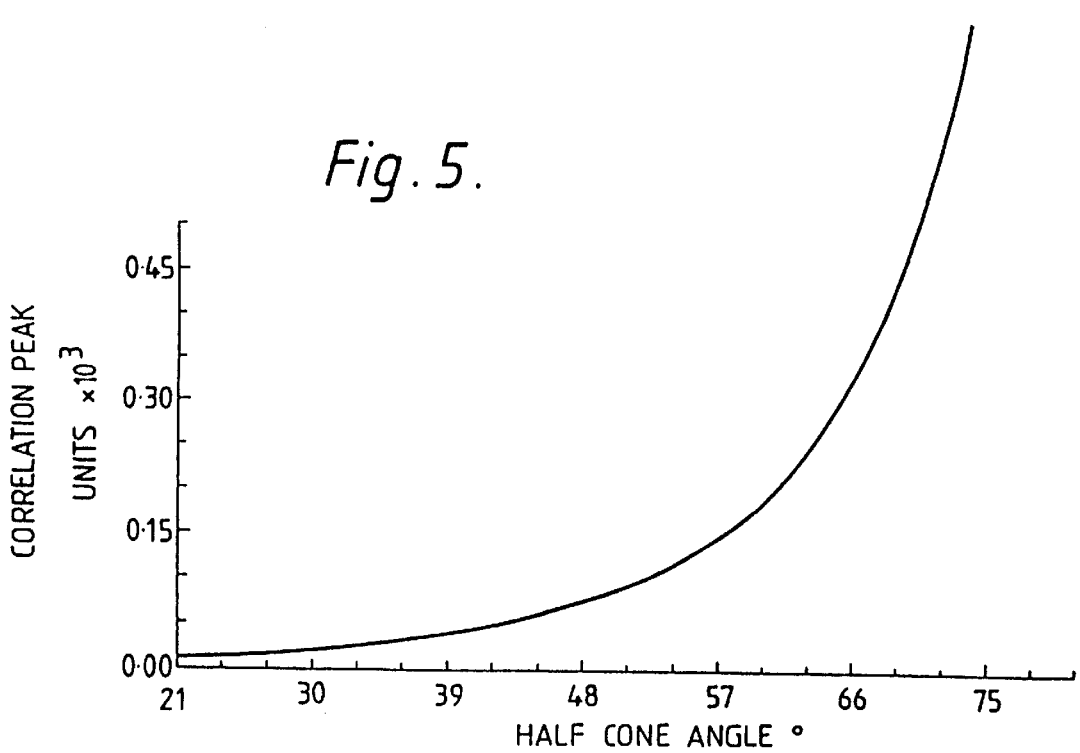
FIG. 5 is a graph of cross correlation function against half cone angle.

FIG. 5 shows the variation of correlation peak with half cone angle for a 20 mm diameter crystal growing at 0.5 cm/hour. The steep rise at higher angles assists in accurate control of grow-out since failures are most likely at these higher angles.

Figure 6:
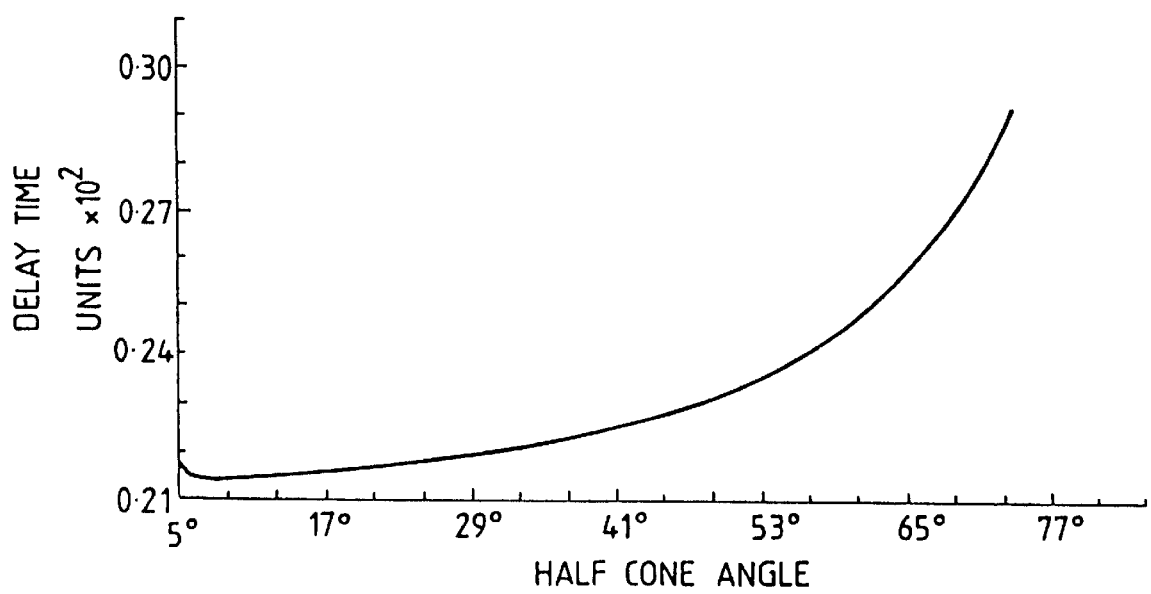
FIG. 6 is a graph of delay of correlation peak as cone angle varies.

Instead of using the magnitude of the correlation peak, a control signal may be derived from the delay in the occurence of that peak. The curve shown in FIG. 6 is a computer simulation for a crystal 20 mm diameter. Position in delay time of the correlation peak varies strongly with cone angle for higher cone angles and provides a useful alternative counter signal. Alternatively again, some combination of the two methods may be used.

Figure 7:
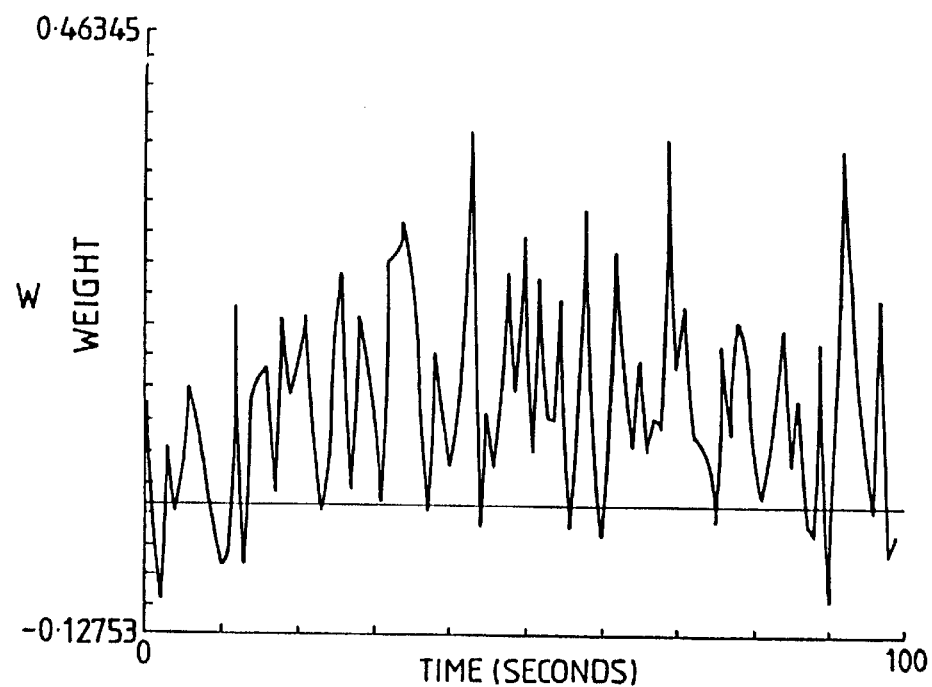
FIG. 7 is a graph of load cell output W against time.
Figure 8:
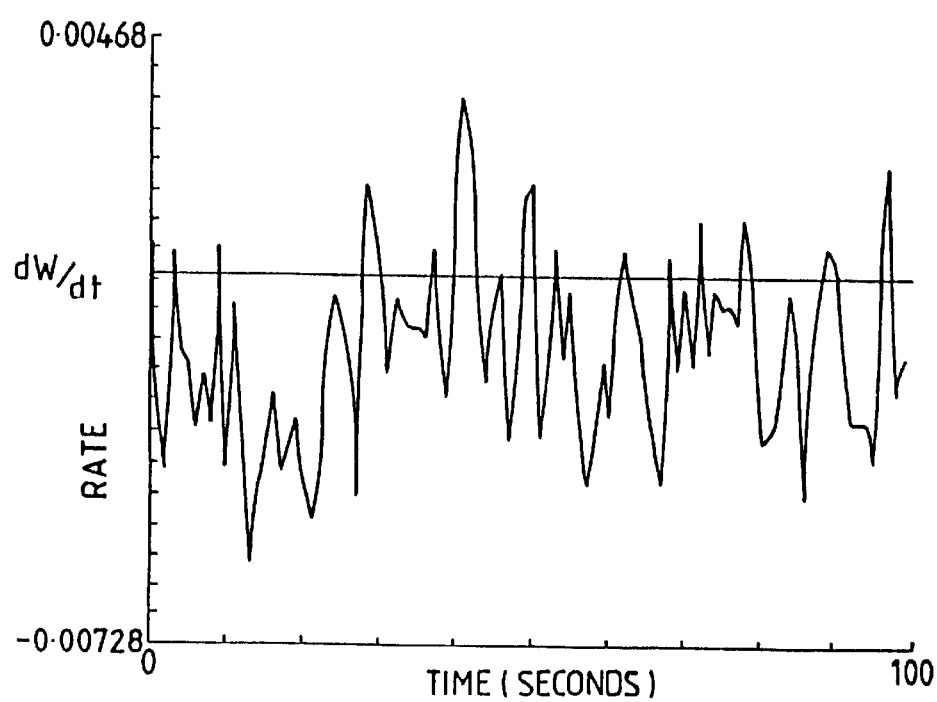
FIG. 8 is a graph of the differentiated weight signal dW/dt against time.

FIG. 7 shows the load cell 9 output W against time, and FIG. 8 shows the differentiated weight signal dW/dt against time; the effect of St is not readily observed in either FIG. 7 or 8. However, after cross correlation, the correlation peaks (FIGS. 3(a) and (b)) are clearly visible and useful for the control of crystal cone angle during grow out, FIG. 2, 1(a)–1(b). This demonstrates the power of the signal processing in obtaining well defined signals for use in error correction during the crystal grow-out phase.

As an alternative to applying St to heater power for controlling crystal growing radius, signal St may be applied to the pull and rotation motor 17. Such a system is shown in broken line in FIG. 1. The signal St from generator 21 is applied via a switch 18, direct to the pull rate motor 17. Crystal weight w, and dw/dt continue to be used as before.

The apparatus may be calibrated either empirically or by use of computer simulation involving the system transfer function.

When a growing crystal has grown out to its required diameter the signal of dW/dt, and $d^2W/dt^2$ if necessary, may be gradually mixed into the input to the mixer 23. Signal St may also be gradually reduced. The constant diameter section is then grown using the anomaly control as taught in GB 1,494,342. This involves using both dW/dt and, in some cases $d^2W/dt^2$, weight signals to provide error correction signals. Alternatively the constant diameter section down to 1c, FIG. 2, may also be grown using signal St.

After the required length of constant diameter crystal has-been grown the crystal diameter is gradually reduced 1c until terminated at 1d. The test signal St may also be used during this phase.

What is claimed is:

1. A method of controlling the diameter of a growing crystal including the steps of:

providing a melt of material in a crucible heated by a heater supplied by a power input;

bringing a seed crystal into contact with the melt;

providing a rate of relative rotation between the seed crystal and the melt; and withdrawing the seed from said melt at a pull rate so that a crystal grows from the seed crystal, wherein during said withdrawing step there are included the additional steps of:

perturbing at least one of said power input to said heater, a rate of seed withdrawal, a rate of relative rotation between crucible and seed, and an applied magnetic field;

weighing one of the growing crystal and the melt to provide a weight signal indicative of the weight of the growing crystal; and providing a feedback loop using signal processing of the weight signal to control said at least one of said power input, said pull rate, said rate of relative rotation and said magnetic field to control crystal diameter.

2. The method of claim 1 wherein the perturbations are variations in power input to the melt heater.

3. The method of claim 1 wherein the perturbations are variations in the pull rate.

4. The method of claim 1 wherein the perturbations are variations in the relative rotation rate of the crystal and melt.

5. The method of claim 2 wherein the variations are rectangular wave signals.

6. The method of claim 2 wherein the variations are a pseudo random series of pulses.

7. The method of claim 1 wherein the signal processing is a cross correlation between the perturbation and weight signals.

8. The method of claim 7 wherein the amplitude of correlation peak values is compared with a reference signal to control crystal diameter change.

9. The method of claim 1 wherein the signal processing is an autocorrelation of the weight signal.

10. The method of claim 1 wherein the signal processing is a Fourier analysis of the weight signal.

11. The method of claim 1 wherein the signal processing is a signal averaging of the weight signal.

12. Apparatus for growing crystals comprising:

a crucible for containing a melt of the crystal to be grown;

a heater responsive to a power input for heating the meld;

means for providing relative rotation rate between a seed crystal and the melt;

means for pulling a crystal from the melt at a pull rate;

perturbation means for perturbing one of said power input, said pull rate, said rate of relative rotation and a magnetic field concurrent with operation of said pulling means;

a load cell for measuring one of the weight of a growing crystal and said crucible concurrent with operation of said pulling means, and providing a weight signal;

feedback means for controlling said one of said power input, said rotation rate, said pull rate and said magnetic field in response to said perturbing means and said weight signal concurrent with operation of said pulling means; and means for comparing the output of the feedback means with a reference signal to provide a correction signal for the feedback means.

13. The apparatus of claim 12 and wherein the perturbating means applies perturbating signals (St) to the feedback means.

14. The apparatus of claim 12 wherein the perturbating signals (St) are applied to the melt heater.

15. The apparatus of claim 12 wherein the perturbating signals (St) are applied to the means for pulling a crystal from the melt.

16. The application of claim 12 wherein the means for applying perturbating signals is a rectangular waveform generator.

17. The application of claim 12 wherein the means for applying perturbating signals is a pseudo random pulse code generator.

18. The apparatus of claim 12 wherein said feedback means includes a cross correlator.

19. The apparatus of claim 12 wherein said feedback means includes an auto correlator.

20. A method of controlling the diameter of a growing crystal during crystal grow out from seed diameter to a desired diameter, said method including the steps of:

providing a melt of material in a crucible hearted by a heater supplied by a power input;

bringing a seed crystal into contact with the melt;

providing a rate of relative rotation between the seed crystal and the melt; and withdrawing the seed from said melt at a pull rate so that a crystal grows out with an increasing diameter from the seed crystal, wherein during said grow out from said seed crystal to said desired diameter, there are included the additional steps of simultaneously:

controllably perturbing at least one of said power input to said heater, a rate of seed withdrawal, a rate of relative rotation between crucible and seed, and an applied magnetic field;

weighing one of the growing crystal and the melt to provide a weight signal indicative of the weight of the growing crystal; and providing a feedback loop using signal processing of the weight signal to control said at least one of said power input, said pull rate, said rate of relative rotation and said magnetic field to control crystal diameter.

21. Apparatus for controlling the diameter of growing crystals during crystal grow out from seed diameter to a desired diameter, said apparatus comprising:

a crucible for containing a melt of the crystal to be grown;

a heater responsive to a power input for heating the melt;

means for providing relative rotation rate between a seed crystal and the melt;

means for pulling a crystal from the melt at a pull rate;

perturbation means for controllably perturbing one of said power input, said pull rate, said rate of relative rotation and a magnetic field concurrent with operation of said pulling means during crystal grow out from said seed diameter to said desired diameter;

a load cell for measuring one of the weight of a growing crystal and said crucible concurrent with operation of said pulling means, and providing a weight signal;

feedback means for controlling said one of said power input, said rotation rate, said pull rate and said magnetic field in response to said perturbing means and said weight signal concurrent with operation of said pulling means; and means for comparing the output of the feedback means with a reference signal to provide a correction signal for the feedback means.

22. A method of controlling the diameter of a growing crystal including the steps of:

providing a melt of material in a crucible heated by a heater supplied by a power input;

bringing a seed crystal into contact with the melt;

providing a rate of relative rotation between the seed crystal and the melt;

withdrawing the seed from said melt at a pull rate so that a crystal grows from the seed crystal wherein during said withdrawing step there are included the additional steps of:

weighing one of the growing crystal and the melt to provide a weight signal indicative of the weight of the growing crystal;

applying perturbating signals of a controllable amplitude to at least one of said power input to said heater, a rate of seed withdrawal, a rate of relative rotation between crucible and seed, and an applied magnetic field, said perturbating signals being of sufficiently small value that they do not degrade crystal growth;

processing said weight signal to distinguish between the effects of said perturbating signals present in said weight signal, weight of growing crystal, and system noise to produce a processed signal;

using said perturbating signals in said processed signal to control said at least one of said power input, said pull rate, said rate of relative rotation and said magnetic field to control crystal diameter during growth from a seed to a required crystal diameter;

selectively reducing the amplitude of said perturbating signal to zero whilst growing said crystal using said weight signal;

whereby the diameter of the growing crystal may be controlled from a seed diameter to a larger and substantially uniform diameter for a required length of crystal.

23. Apparatus for growing crystals comprising:

a crucible for containing a melt of the crystal to be grown;

a heater responsive to a power input for heating the melt;

means for providing relative rotation rate between a seed crystal and the melt;

means for pulling a crystal from the melt at a pull rate;

means for applying perturbating signals of a controllable amplitude to one of said power input, said pull rate, said rate of relative rotation and a magnetic field concurrent with operation of said pulling means;

a load cell for measuring one of the weight of a growing crystal and said crucible concurrent with operation of said pulling means, and providing a weight signal;

means for processing said weight signal to distinguish between the effects of said perturbating signals present in said weight signal, weight of growing crystal, and system noise to provide a processed signal;

means for selectively reducing said perturbating signals to zero amplitude during crystal growth;

means for comparing said processed signal with a reference signal to provide a correction signal;

means for applying said correction signal to means for controlling said one of said power input, said rotation rate, said pull rate and said magnetic field in response to said perturbing means and said weight signal concurrent with operation of said pulling means.

* * * * *